United States Patent [19]

Kojima et al.

[11] Patent Number: 5,444,040
[45] Date of Patent: Aug. 22, 1995

[54] SUPERCONDUCTIVE OXIDE SINGLE CRYSTAL AND MANUFACTURING METHOD THEREOF

[75] Inventors: Hironao Kojima; Isao Tanaka, both of Yamanashi, Japan

[73] Assignee: Seiko Epson Corporation, Tokyo, Japan

[21] Appl. No.: 973,608

[22] Filed: Nov. 6, 1992

Related U.S. Application Data

[63] Continuation of Ser. No. 451,769, Dec. 18, 1989, abandoned.

[51] Int. Cl.$^6$ .............................................. C30B 13/26
[52] U.S. Cl. .................... 505/238; 505/234; 505/235; 505/451; 505/452; 117/49
[58] Field of Search ................. 156/620.73, 620.74; 505/1, 729, 740, 234, 451, 235, 452, 237, 238; 117/49, 50, 51, 52

[56] References Cited

U.S. PATENT DOCUMENTS 4,956,334  9/1990  Oka et al. ...................... 156/617.1
5,057,492 10/1991  Oka et al. ...................... 505/1

FOREIGN PATENT DOCUMENTS 1-179790  7/1989  Japan ............................. 156/620.73

OTHER PUBLICATIONS

Morris et al., "Preparation of High-Quality, Single Crystals of 90°K Superconducting YBa$_2$Cu$_3$O$_7$, M.R.S. extended abstracts, High-Temperature Superconductors" 11 Apr. 1988, pp. 43–46.
Chen et al, "The Flux Growth of Crystals of (La,Sr)$_2$CuO$_4$ and (La,Sr)CuO,Solid State Communications", vol. 65, No. 16, pp. 611–612 1988.
Katayama-Yoshida et al, "Growth of YBa$_2$Cu$_3$O$_7$ Single Crystals", Japanese Journal of Applied Physics, re. 12, Dec. 1987 pp. 2007–2009.
Gazit et al, "Laser-Heated Pedestal Growth of High Tc Bi Sr-Ca-Cu-O Superconducting Fibers", Journal of Crystal Growth vol. 91 (1988) pp. 318–330.
Takekawa et al, "Single Crystal Growth of The Superconductor Bi$_2$(Bi$_{.2}$Sr$_{1.8}$ Ca$_1$)Cu$_2$O$_8$", Journal of Crystal Growth, vol. 92 (1988), pp. 687–690.
Trouilleux et al, "Growth and Anisotropic Magnetici Behaviour of Aligned Eutectic-Type Structures . . . ", Journal of Crystal Growth, vol. 91 (1988) pp. 268–273.
Kambe et al, "Anisotropic Resistivity in the Two-Dimensional Metal LaSr-Ca-O." Physica C. vol. 160 (1) pp. 35–41, abstract only.
Tanaka et al., Japan Chemistry Association, 57th Annual Convention p. 232, Sep. 6, 1988, Japan Chemistry Association.
Tanaka et al., 33rd Artificial Mineral Forum Collection, Artificial Mineral Society pp. 71–72, Sep. 24, 1988.
Kojima, Solid State Physics, 9, vol. 24 (9), 1989 (Sep. 15, 1989) pp. 711–715.
Kojima et al., 21st Molten Salt Chemistry Forum Collection, pp. 3–4, Nov. 5, 1989.
Tanaka et al., J. Crystal Growth, 96 (3), 711–715 (1989) (Jul., 1989).

*Primary Examiner*—Robert Kunemund
*Attorney, Agent, or Firm*—Michael N. Meller

[57] ABSTRACT

A method of manufacturing a single crystal of a superconductive oxide by a travelling solvent floating zone method (TSFZ Method). In this manufacturing method, a sintered feed rod of an oxide belonging to a tetragonal system, exhibiting anisotropic properties and superconductive properties and having a stoichiometric composition of the superconductive oxide is melted into a layer of a solvent mainly consisting of a oxidized copper and arranged in an infrared heating furnace under an oxygen pressure thereby growing a large single crystal of the superconductive oxide which is 5 mm or over in diameter and 40 mm or over in length.

The superconductive oxide is one selected from the group consisting of La$_{2-x}$A$_x$CuO$_4$(A:Sr,Ba), Nd$_{2-x}$Ce$_x$CuO$_4$, YBa$_2$Cu$_3$O$_{7-x}$, BiSrCaCu$_2$O$_x$, Tl$_2$Ba$_2$Ca$_2$Cu$_3$O$_x$, and the growth of the single crystal is effected in such a manner that after the feed rod has been melted into the solvent having a composition of 55 to 91 mol % CuO, the single crystal is grown and increased in size under the following growth conditions: oxygen pressure=0.15 MPa or over, growth temperature=1100° to 1300° C. and growth rate=0.5 to 3 mm/h. Further, in the growth of the single crystal, a seed crystal is used and the seed crystal is grown by a necking growth process to effect the crystal growth along its a-axis. Further, the grown single crystal is annealed in the presence of oxygen or nitrogen.

8 Claims, 11 Drawing Sheets

SUPERCONDUCTIVE OXIDE SINGLE CRYSTAL AND MANUFACTURING METHOD THEREOF

This application is a continuation of application Ser. No. 451,769, filed Dec. 18, 1989 now abandoned.

BACKGROUND OF THE INVENTION

1. Field of the Invention

The present invention relates to superconductive oxides whose critical temperatures are in a high temperature range, and more particularly the invention relates to single crystals of such oxides as $La_{2-x}A_xCuO(A:Sr, Ba)$, $Nd_{2-x}Ce_xCuO_4$, $YBa_2CuO_4$, $YBa_2ACu_3O_{7-x}$, $BiSrCaCu_2O_x$ and $Tl_2Ba_2Ca_2CuO_x$ and a manufacturing method thereof.

2. Description of the Prior Art

Since Dr. J. G. Bedonoz And Dr. K. A. Muller discovered in 1986 that even oxides could exhibit superconductive properties at elevated temperatures, the investigations of many superconductive oxides have been conducted throughout the world.

It has been known that certain types of oxides, e.g., $La_{2-x}A_xCuO_4(A:Sr, Ba)$, $Nd_{2-x}CeCuO_4$, $YBa_2Cu_3O_{7-x}$, $BiSrCaCu_2O_x$ and $Tl_2Ba_2Ca_2Cu_3O_x$ exhibit superconductivity at higher critical temperatures than those of conventional metal type superconducting materials, although these oxides are extremely low in density of states of electrons.

The investigations of these oxides have mainly dealt with sintered materials and thin films and the investigations have considerably gone into detail with respect to the crystal structures and the relation between the chemical compositions and the critical temperatures.

However, there have been known no established principles on the superconducting mechanism of these superconductive oxides.

With practically all of the oxide superconducting materials which have been reported up to the date, their basic structure is composed of the perovskite lattice and they belong to the tetragonal system or the orthorhombic system and not to the cubic system differing from the metal or alloy superconducting materials. Consequently, it has been considered that the anisotropic information cannot be obtained from the physical properties of the sintered materials which are aggregates of polycrystals, that it is difficult to obtain the information in the thickness direction of the thin films and that it is difficult to construct the superconducting mechanism of these materials.

In order that the physical properties, e.g., the anisotropy of the magnetic and electric properties of any oxide can be measured precisely to obtain the anisotropy information and elucidate its superconductivity, a large and good-quality single crystal of the oxide is required and therefore there is a need for the growth of a single crystal which is good in quality and large in size.

Included among the single crystals of the oxides of the high-temperature superconducting materials which have been reported as succeeded in growing up to the data are LA—Sr—Cu—O group, Nd—Ce—Cu—O group, Y—Ba—Cu—O group, Bi—Ca—Ba—Cu—O group, etc. Since practically all of these materials are considered to be decomposed and molten compounds, it is impossible to use for the growing of single crystals such melting and solidifying methods as the pull method and the Bridgman method which have been used for manufaturing the ordinary oxide single crystals. The methods used mainly for the purpose include the flux method and the top seeded solution method which is a modification of the flux method, and an attempt employing the floating zone method on a single crystals of Bi-group has been reported by Takekawa et al [J. Crst. growth, 982(1988)9687].

Also, there has been a report on the eutectic composition crystals of $La_2CuO_4$ and $CuO$ as shown in Table 1 which will be described later [L. Trouilleux. G. Dhalenne and A. Revcolevschi: Cryst Growth, 91(1988)268].

The solvent used in the flux method is CuO, called as a self flux, in many instances and after a crystal has been grown, the flux and the formed crystal are separated mechanically, thus making it difficult to separate the solvent and the grown crystal from each other.

In the case of a single crystal of lanthanum-system $La_{2-x}A_xCuO_4$ group, however, the crystal grown in the flux and sunk to the bottom of the crucible is taken up thus trying to separate it from the solvent.

In any case, crystals grown by the flux method are not so large in size and the flux is contained in any large-size crystals grown. Also, a thin planar crystal is generally grown along the c-axis.

The following Table 1 shows the sizes of the crystals grown, the solvents and growing methods used, the critical temperatures, etc., which have been reported up to the date with respect to the single crystals of lanthanum-group.

TABLE 1

Examples of growing $La_{2-x}A_xCuO_4$ (A:Sr, Ba) single crystal

| METHOD | SOLVENT | SIZE OF CRYSTAL | $T(c)$ (K) | $\Delta Tc$ (K) |
|---|---|---|---|---|
| Flux Method | | | | |
| Ref. 1 | CuO | 8 × 8 × 2 | 30 | 26.2 |
| Ref. 2 | | 25 × 20 × 5 | 25 | 13 |
| Ref. 3 | PbO | 0.14 × 0.14 × 0.009 | 8.5–9.0 | Broad |
| Ref. 4 | CuO | 17 × 14 × 1 | N.D. | |
| Ref. 5 | CuO | 4 × 7 × 0.1 | 13.4 | |
| Ref. 6 | CuO | 2 × 1 × 0.2 | 26 | |
| Top seeded solution method | | | | |
| Ref. 7 | CuO | 18 mm$\phi$, 4 mm long | N.D. | |
| Ref. 8 | CuO, $Li_4B_2O_5$ or $Na_2B_2O_4$ | 25 × 25 × 5 | <4 | |
| Ref. 9 | CuO | 8 × 8 × 12 | <5 | |
| Floating zone method | | | | |
| Ref. 10 | eutectic | 7 mm$\phi$, several cm long | 35 | |

Ref. 1: Y. Hidaka, Y. Enomoto, M. Suzuki, M. Oda and T. Murakami: J. Cryst. Growth, 85 (1987) 581.
Ref. 2: S. Shamot: Solid State Commun., 66 (1988) 1151
Ref. 3: H. H. Wnag, U. Geiser, R. J. THorn, K. D. Carlson, M. A. Beno, M. R. Monaghan, T. J. Allen, R. B. Proksch, D. L. Stupka, W. K. Kwok, G. W. Crabtrree and J. M. Williams: Inoganic Chem. 26 (1987) 1190.
Ref. 4,7: K. Oka and H. Unoki: Jpn. J. Appl. Phys., 26 (1987) L1590
Ref. 5: U. Kawbe, H. Hasegawa, T. Aita and T. Ishiba: Jpn. J. Phys., 26 Supplement-3 (1987) 1135.
Ref. 6: A. B. Bykov, L. N. Demyanets, N. D. Zakharov, B. Y. Kotyuzhanskii, I. N. Makarenkp, O. K. Melnicov, V. M. Molchanov, L. A. Prozorova and L. V. Svistunov: Pisma. ZH. Eksp. Tecr. Fiz., 46 (1987) 19.
Ref. 8: P. L. Picone, H. P. Jenessen and D. R. Gabbe: J. Gryst. Growth, 85 (1987) 576.
Ref. 9: A. B. Bykov, L. N. Demianets, I. P. Zibron, G. V. Kanunnikov, O. K. Melnikov and S. M. Stishov: J. Cryst. Growth, 91 (1983) 302.
Ref. 10: L. Trouilleux. g. Dhalenne ans A. Revcolevschi: J. Cryst. Growth, 91 (1988) 268.

As will be seen from Table 1, the planar crystals were produced in practically all the cases as mentioned previously. The sizes of the crystals grown by the top seeded solution method were as considerable large as 25×25×5 mm but were very low in critical temperature. This is considered to be due to the fact that the solid solution Sr(Ba) was less than the raw material composition. Also, in the case according to the floating zone method shown in the last part of Table 1, although the crystal grown was large in size and was also somewhat higher in critical temperature than those of the other methods, the raw material composition was an eutectic composition including CuO and the crystal grown was an autectic crystal which could not be said to be a single phase crystal.

As described hereinabove, the conventional superconductive oxide crystals were either not so large in size or containing the flux in the case of the large ones and also they were each in the form of a thin planar crystal along the c-axis, thus making it difficult to precisely measure the physical properties of the oxides such as the anisotropy of the magnetic and electric properties to obtain the desired anisotropic information and also making it difficult to construct the superconducting mechanism of the single crystals.

SUMMARY OF THE INVENTION

It is therefore an object of the present invention to provide a superconductive oxide single crystal which is excellent in quality and large in size and is well suited for elucidating the superconductivity of the oxide and a manufacturing method thereof.

Thus, in accordance with a first aspect of the present invention there is provided a superconductive oxide single crystal characterized by being manufactured by preparing a sintered feed rod of an oxide belonging to the tetragonal crystal and exhibiting anisotropy and superconductivity, the rod having the stoichiometric composition of the superconductive oxide, melting the sintered feed rod in a solvent material consisting mainly of cupric oxide placed in an infrared concentrated heating furnace under an oxygen pressure and growing a single crystal of a large size. The superconductive oxide is substance selected from the group consisting of $La_{2-x}A_xCuO_4(A:Sr,Ba)$, $Nd_{2-x}Ce_xCuO_4$, $YBa_2Cu_3O_{7-x}$, $BiSrCaCu_2O_x$ and $Tl_2Ba_2Ca_2Cu_3O_x$, and the superconductive oxide single crystal is greater than 5 mm in diameter and greater than 40 mm in length.

In this connection, while the superconductive oxides are generally defined as above, for clarification purposes they are also defined as follows, together with the ranges of the variables:

| | |
|---|---|
| $La_{2-a}Sr_aCuO_4$ | $0 \leq a \leq 0.3$ |
| $La_{2-b}Ba_bCuO_4$ | $0 \leq b \leq 0.13$ |
| $Nd_{2-c}Ce_cCuO_4$ | $0.12 < c < 0.17$ |
| $YBa_2Cu_3O_{7-d}$ | $0 < d < 0.5$ |
| $BiSrCaCu_2O_e$ | $8.5 < e < 9.5$ |
| $Tl_2Ba_2Ca_2Cu_3O_f$ | $9.5 < f < 10.5-$ |

In accordance with a second aspect of the present invention, there is provided a method of manufacturing a superconductive oxide single crystal comprising forming a sintered feed rod of a superconductive oxide having the stoichiometric composition of the oxide, melting the sintered feed rod in a solvent material mainly consisting of cupric oxide and placed in an infrared concentrated heating furnace under the application of an oxygen pressure and growing a single crystal of a large size. The superconductive oxide is a substance selected from the group consisting of $La_{2-x}A_xCuO_4(A:Sr,Ba)$, $Nd_{2-x}CeO_4$, $YBa_2Cu_3O_{7-x}$, $BiSrCaCu_2O_x$ and $Tl_2Ba_2Ca_2Cu_3O_x$. The method features that during the growth of a single crystal, the sintered feed rod is melted in the solvent having composition of 55 to 91 mol % CuO and the single crystal is grown to a large size under the growth conditions: oxygen pressure, over 0.15 MPa; growing temperature, 1100° to 1300° C.; and growth rate, 0.5 to 3 mm/h. The method also features that in the growing of a single crystal, a seed crystal is used and the seed crystal effects its crystal growth in the direction of the a axis by necking growth and that the crystal grown in the form of a single crystal is further annealed in the presence of oxygen or nitrogen.

DESCRIPTION OF THE PREFERRED EMBODIMENTS

The present invention is directed to the growing of a superconductive oxide single crystal and increasing its size by the travelling solvent floating zone method (hereinafter referred to as the TSFZ method).

Figures 12A, 12B:
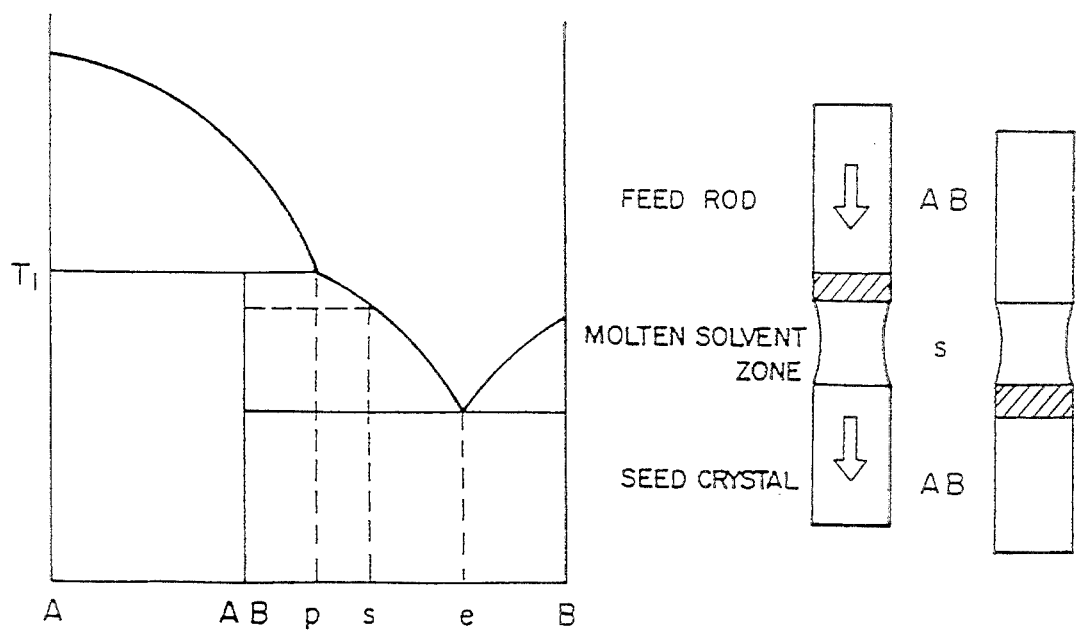
FIG. 12(a) is a type phase diagram of a decomposed and melted compound AB according to the TSFZ method.
FIG. 12(b) is a diagram useful for explaining the principle of the TSFZ method.

The TSFZ method has been stated in G. A. Wolff: "CRYSTAL GROWTH Theory And Techniques p194–230" G. H. L. Goodman Ed, (Prenum, 1974), and the TSFZ method is generally applicable to decomposed and melted compounds and solid-state single crystals. For instance, if a phase diagram such as shown in FIG. 12(a) is known for a compound AB, this compound is decomposed at a temperature $T_1$ and it has a composition including a solid phase A and a liquid phase P. In order to grow a single crystal of this compound, it is necessary to grow it at a temperature below the temperature $T_1$.

At temperature below the temperature $T_1$, the solid AB is in equilibrium with the liquid phases in the compositions on the liquidus line upto the eutectic temperature. The TSFZ method utilizes this point.

In other words, the composition S which is in equilibrium with the solid AB is sandwiched between A sintered feed rod and a seed crystal as shown in FIG. 12(b) so that the composition S is melted first so as to fuse together the sintered feed rod and the seed crystal, respectively. Then, when the whole composition is slowly moved downward, the composition AB begins precipitating on the seed crystal. When this state becomes stationary, the feed rod composition AB is melted so that the composition AB is precipitated on the seed crystal and a single crystal of the composition AB is grown.

In other words, while the TSFZ method uses a solvent so that a feed material is melted into the solvent and the desired material is precipitated from the solvent. The slow cooling floating zone method (referred to as the SCFZ method) is utilized for the formation of a phase diagram such that by melting a substance of a certain composition to separate its molten zones while cooling them, the constituents can be solidified in order of melting point and the subsequent analysis of this order results in a phase diagram showing what phase is melted first, what comes next and so on.

The present invention makes use of the TSFZ method.

Figure 1:
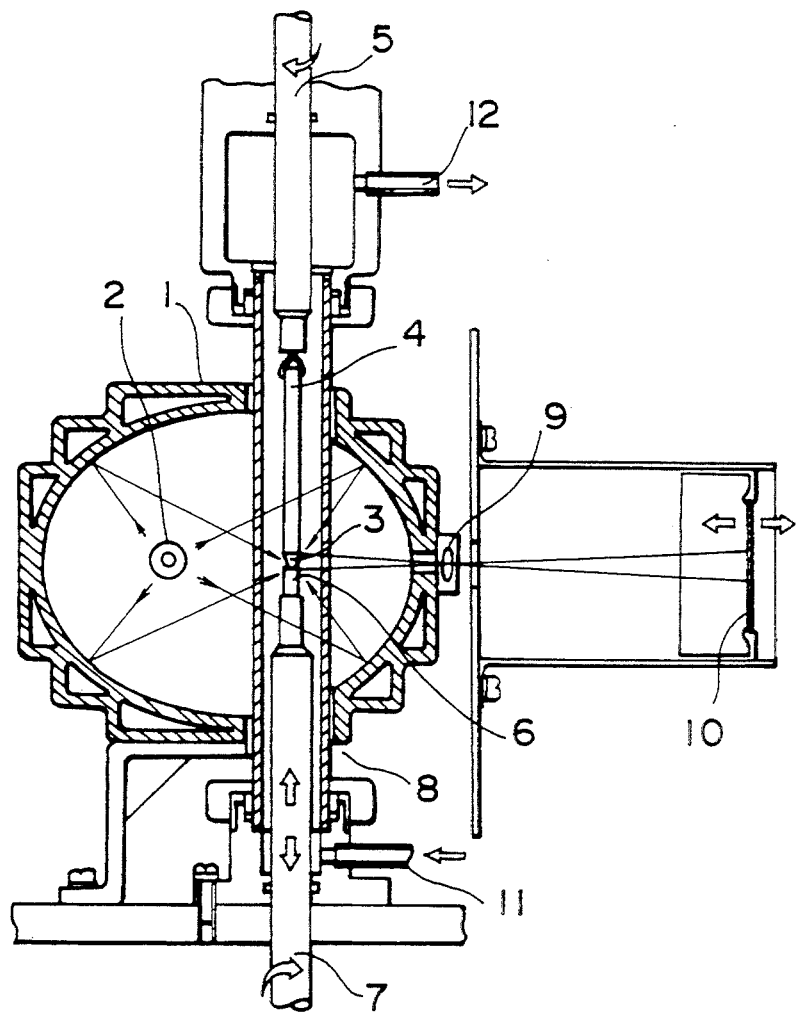
FIGS. 1 and 2 are schematic diagram showing respectively infrared concentrated heating furnaces employing respectively a single ellipsoidal-type rotating ellipsoidal reflector and a double-ellipsoidal-type rotating ellipsoidal reflector, which are used for the manufacture of a superconductive oxide single crystal according to the present invention.
Figure 2:
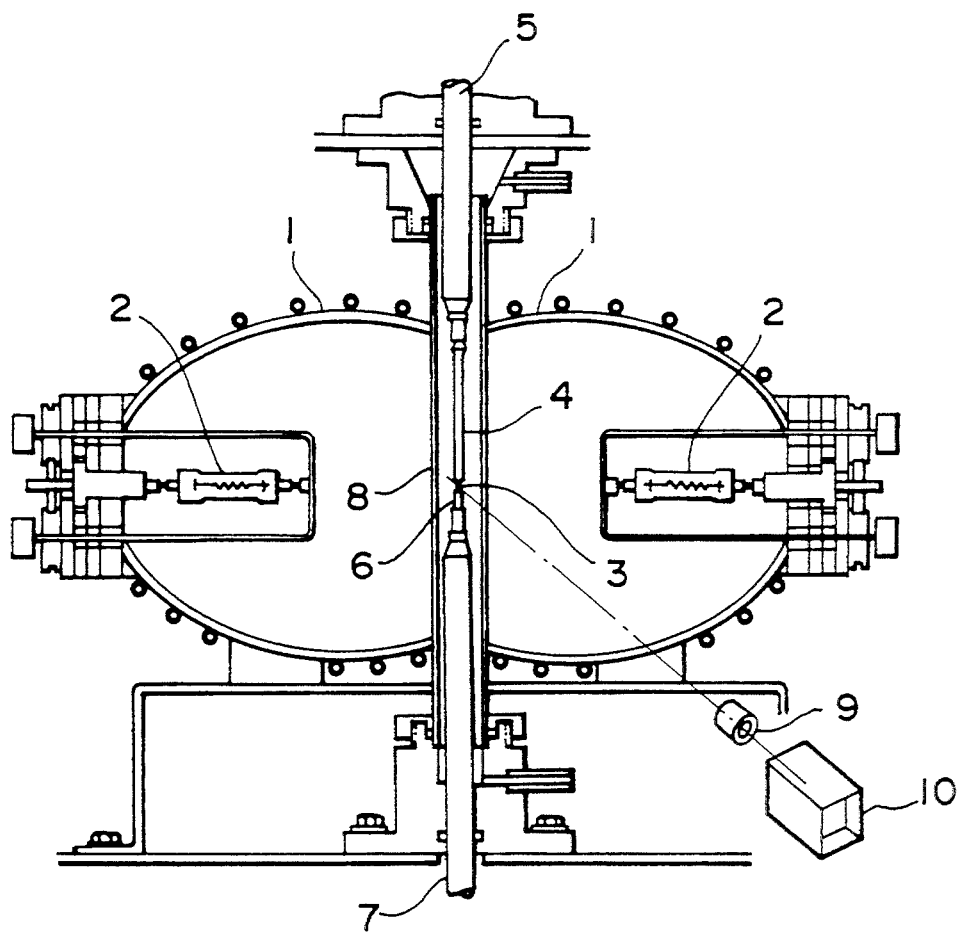

Also, as a heating furnace used for the growth of a single crystal, it is desirable to use an infrared concentrated heating furnace, particularly an infrared heating furnace employing a single ellipsoidal-type or double ellipsoidal-type rotating ellipsoidal reflector as shown in FIGS. 1 or 2 showing an embodiment of the invention which will be described later.

Figure 13:
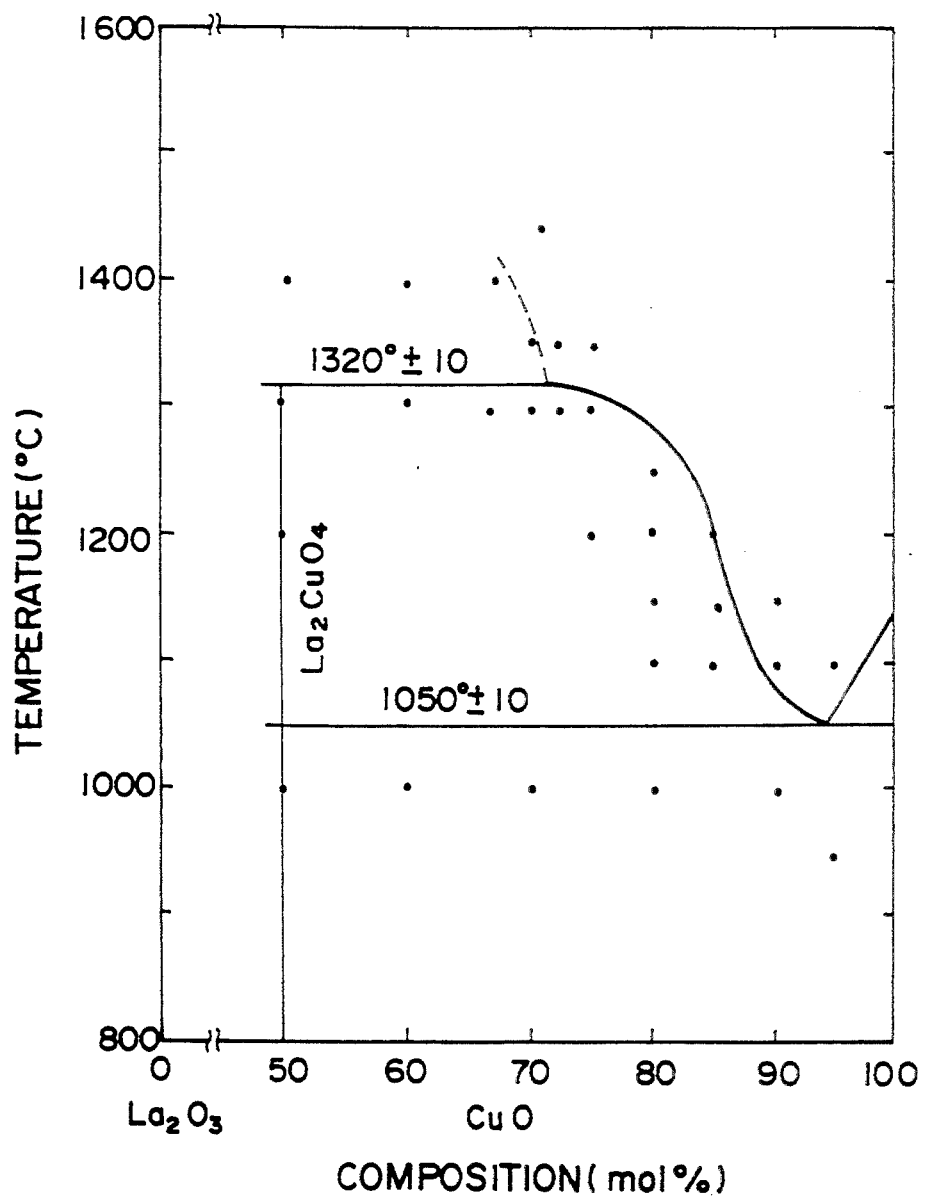
FIG. 13 is a phase diagram of the $La_2O_3$—CuO group in the air.

Considering that in accordance with the phase diagram of the $La_2O_3$—CuO group shown in FIG. 13 the formation of a solid solution would cause Sr to substitute La, the inventors have known that in order to grow a crystal of $La_{2-x}Sr_xCuO_4$, it is only necessary to refer to the $La_2O_3$—CuO group phase diagram.

Figure 14:
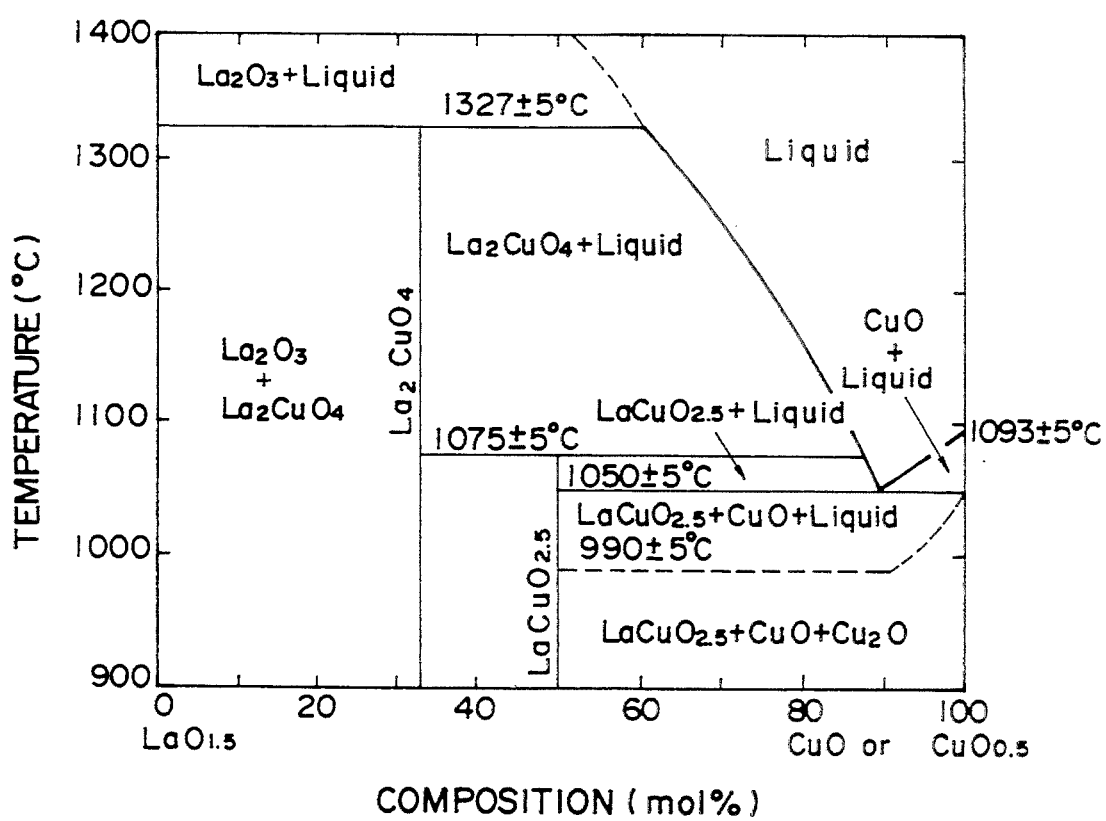
FIG. 14 is a phase diagram, of the $LaO_{1.5}$—CuO Group.

FIG. 14 is the $LaO_{1.5}$—CuO group phase diagram

As a preliminary test of the present invention composition of 20 mol % $La_2O_3$ and 80 mol % CuO was melted in an oxygen atmosphere of 0.1 MPa and the resulting molten product was identified thus showing the production of a mixture of $La_2CuO$ and $La_2O_3$. It was considered that while this composition should result in the production of a mixture of $La_2CuO_4$ and CuO according to the phase diagram, the vaporization of CuO took place thus causing the composition to become $La_2O_3$ richer and thus the production of $La_2O_3$ was seen.

Thus, in order to prevent the vaporization of CuO, the oxygen gas pressure was increased to 0.2 MPa and the resulting molten product was a mixture of $La_2CuO_4$ and CuO.

From this it has been found that the manufacture of single crystal requires that during the growing the oxygen gas atmosphere is pressurized to over 0.2 MPa.

It has been proved experimentally that when the oxygen gas is pressurized to over 0.2 MPa, the vaporization is reduced considerably as compared with the case of 0.1 MPa and $La_2CuO_4$ and CuO are produced.

In view of this result, In accordance with the present invention an infrared heating furnace is used and a crystal is grown in its atmosphere which is a pressurized oxygen atmosphere of 0.15 MPa or over, preferably between 0.2 and 0.25 MPa. However, if the growing of a crystal is performed over a long period of time, CuO is vaporized and deposited on the shafts and the quartz tube and therefore the growing rate should preferably be from 0.5 to 3 mm/h.

The growing temperature of less than 1100° C. results in an insufficient melting and the growing temperature of over 1300° C. causes the other phase to precipitate, Thus, a preferred range is between 1100° and 1300° C.

In view of these circumstances, in accordance with the present invention the growth conditions are selected as follows:

Oxygen pressure: 0.15 MPa or over
Growing temperature: 1100° to 1300° C.
Growing rate: 0.5 to 3 mm/h In accordance with the present invention superconductive oxide crystals of over 5 mm in diameter end over 40 mm in length are obtainable and they are good-quality and sizable superconductive crystals which are useful for clarification of the superconductive properties of superconductive oxides. Also, in accordance with the present invention the physical properties. e.g., the anisotropy of the magnetic and electric properties of oxides can be measured precisely to obtain the anisotropy information, thereby contributing toward clarification of the superconductive properties and the study of the superconducting mechanism.

An embodiment of the present invention will now be described.

FIGS. 1 and 2 are schematic diagrams showing respectively an infrared heating furnace of the single ellipsoidal type and an infrared heating furnace of the double ellipsoidal type which are used for the manufacture of a superconductive oxide single crystal according to the present invention.

In the Figures, numeral 1 designates an ellipsoidal reflector, 2 infrared heating furnaces (halogen or xenon lamps), 3 a solvent 4 a sintered feed rod, 5 an upper rotating shaft 5, 6 a seed crystal, 7 a lower rotating shaft, 8 a transparent quartz tube, 9 a lens, 10 a screen, 11 an atmospheric gas inlet, and 12 an atmospheric gas outlet.

The embodiment of the present invention will be described with reference to FIG. 2. The double ellipsoidal rotating reflector 1 is placed with gold so that it efficiently reflects the infrared radiation and possesses durability, and the infrared lamps 2, each consisting of a halogen or xenon lamp of 1.5 KW, are arranged as heating light sources at the outer focuses of the double ellipsoidal rotating reflector 1 so that the infrared radiation emitted from them are condensed at the other focus in the central portion of the reflector.

The solvent 3 is arranged at the other focus. The temperature is adjustable from 0° C. to 2150° C. by varying the voltage off the lamps.

Arranged on the solvent 3 is the sintered feed rod 4 which is suspended from the upper rotating shaft 5.

Also, disposed at the lower end of the solvent 3 is the seed crystal 6 which is supported on the lower rotating shaft 7, and the upper and lower rotating shafts 5 and 7 are movable simultaneously. In addition, the upper rotating shaft 5 can be moved to adjust the spacing between the shafts as desired and each of the shafts is rotatable.

The surroundings of the solvent 3 are shielded from the air by the transparent quartz tube 8 so that the atmosphere and its pressure can be varied. For instance, oxygen can be sealed through the atmospheric gas inlet 11 and an oxygen pressure can be applied.

On the other hand, the condition of the molten zone is projected onto the screen 10 through the lens 9 so that a crystal can be grown while observing the molten condition of the crystal.

Also, compressed air is blown into the ellipsoidal reflector 1 to cool the lamps or the heating sources and also the holders of the rotating shafts are water cooled for the purpose of protecting them from the conduction and convection of heat by the molten zone and preventing overheating of the ellipsoidal reflector.

Some examples in which single crystals were grown by use of the above-mentioned apparatus will now be described.

EXAMPLE 1

In this example, 99.9% pure $La_2O_3$, $SrCo_3$ and CuO (they were manufactured by Furuuchi Chemical Co., Ltd. and had a 99.9% purity) were used as starting materials. These reagents were weighed out for the stoichiometric composition of $La_{2-x}SrCuO_4 (x=0.15)$, mixed in ethanol and then calcined at 850° C. for 12 hours in air.

Then, the calcined material was ground, formed by a so-called rubber press method of filling a commercially available toy balloon with the powdered material and forming the material into a round rod of about 5 mm in diameter and 50 mm in length under the application of a pressure of 1 ton/cm² (100 MPa), and sintering the rods at 1100° to 1200° C. for 12 hours in oxygen thereby preparing sintered feed rods 4 having the composition of $La_{1.85}Sr_{0.15}CuO_4$.

Solvents were prepared by weighing out the raw materials for the composition of 55 to 80 mol % CuO with Sr/(La+Sr) ratios of 0.075 to 0.10 and forming the material having the composition of 78 mol % CuO, 21.8 mol % $La_2O_3$ and 0.02 mol % SF and preparing the solvents in the same manner as the feed rods 4.

For the single crystal growing purposes, a double ellipsoidal-type infrared heating furnace employing two 1.5 KW halogen lamps as heating light sources was used as shown in FIG. 2.

The growth conditions were as follows. The growth rate was 1.0 mm/h and the crystal growth was performed in a growing atmospheric gas consisting of pure oxygen under a pressure of 2 Kg/cm² (0.2 MPa) for preventing the vaporization of cupric oxide.

Also, in order to make the melt thinner and to reduce the formation of nuclei in a crystal thereby reducing the number of nuclei, seed crystals were grown by necking growing and the crystal growth was caused along the a-axis.

Figure 3:
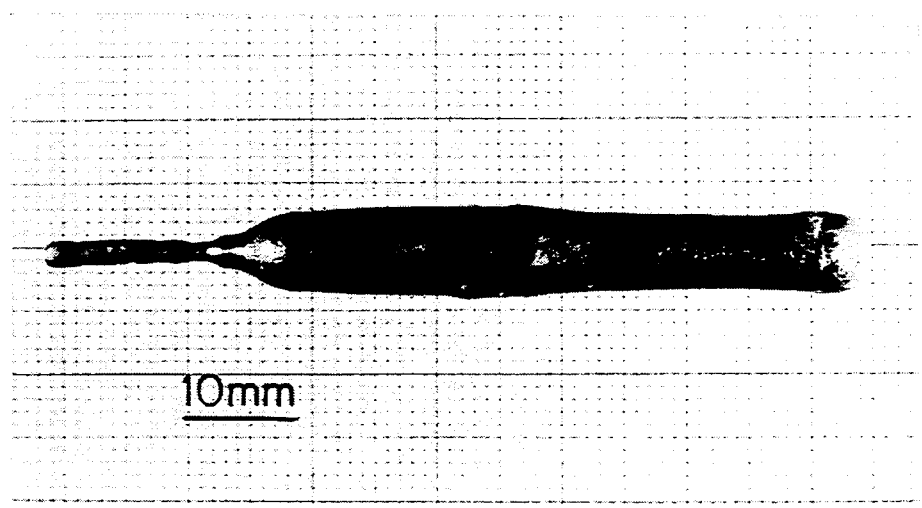
FIG. 3 is a photograph showing the structure of a grown crystal of $La_{2-x}SrCuO_4(x=0.15)$ according to an embodiment of the present invention.

FIG. 3 shows a photograph of the resulting grown crystal. As will be seen from FIG. 3, the product was a black single crystal of 6 mm in diameter and 40 mm in length in the form of a round rod having a metallic luster. Also, there were seen facet on the grown crystal surface in the growth direction.

Figure 4:
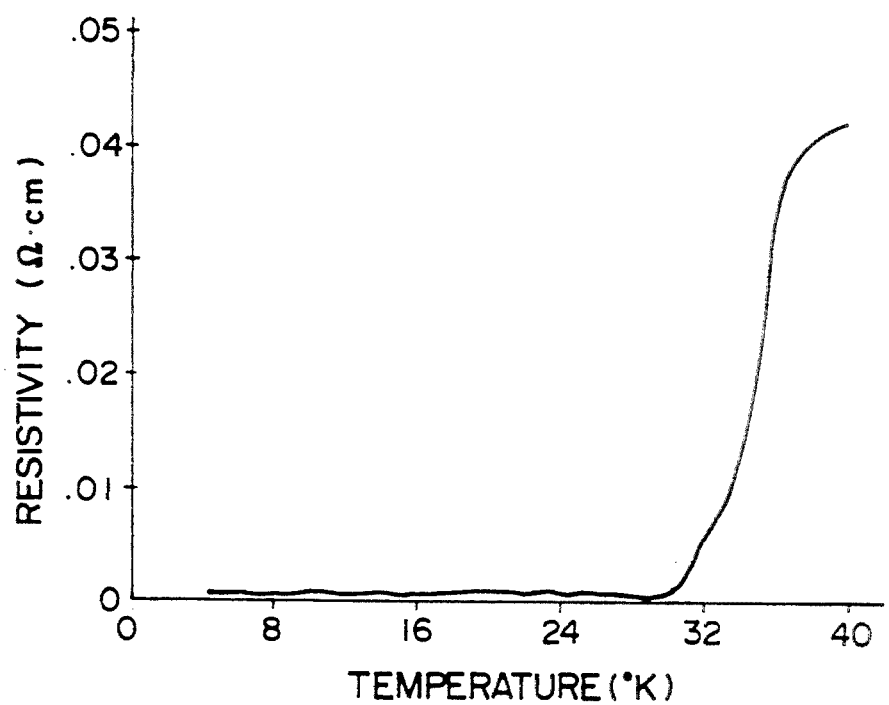
FIG. 4 is a graph showing the measured Meissner's effect of the grown crystal of $La_{2-x}Sr_xCuO_4(x=0.15)$.

FIG. 4 shows a back-reflection lane X-ray photograph of the facet.

An evaluation of the grown crystal by the Xray back-reflection lane method showed the sharp spots as shown in FIG. 4 and thus the grown crystals were identified as single crystals. It was found that the facets observed on the grown crystal surface had the crystallographic plane of (001). Also, neutron scattering tests should that they were good-quality single crystals of the mosaic structure distribution of less than 0.2 degrees.

Further, the radial and axial composition analyses of the grown crystals by EPMA showed that the composition was practically the same and uniform. The following Table 2 shows the results of the quantitative analyses by the use of EPMA and the measured results of the lattice parameters by the powders XRD method.

As will be seen from Table 2, the composition of the grown crystals was determined to be $La_{1.86}Sr_{0.14}CuO_4$ and the La concentration was greater than that of the feed rods. On the other hands, the concentrations of Sr and Cu in the grown crystals were lower than those of the feed rods.

Then, the grown crystal were evaluated on their superconductive properties.

Figure 5:
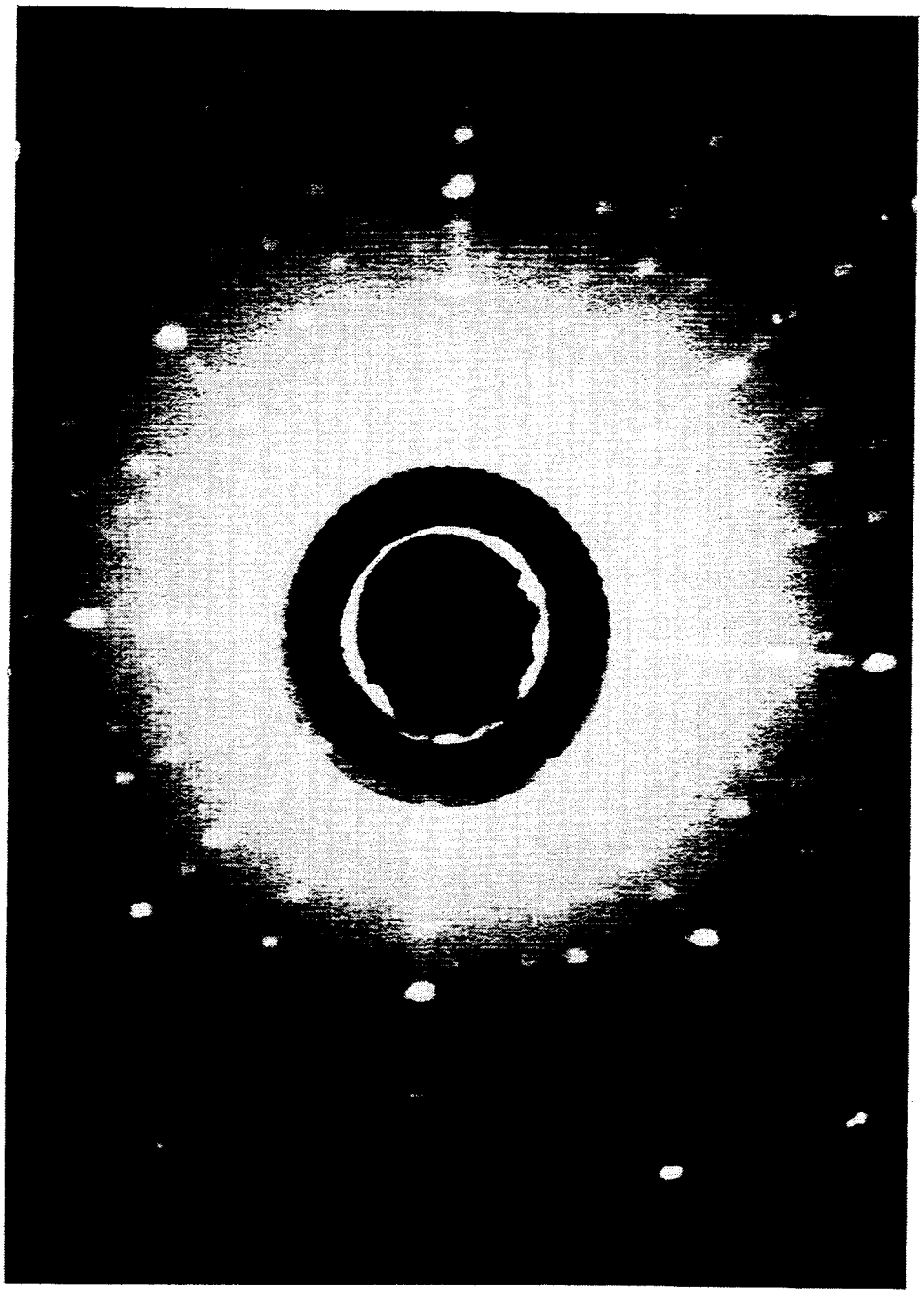
FIG. 5 is a back-reflection lane X-ray photograph of the facet of the crystal of FIG. 4.

FIG. 5 shows the measurement results of the magnetic susceptibility of the grown crystals. As shown in the FIG. 5, the critical temperature $T_{conset}$ (referred to as a superconducting transition initiating temperature Tc) was on the order of 37K and the electric resistivity was completely reduced to zero ohm at $\Delta T_{end}$ (referred to as $\Delta Tc$) of 30K thus exhibiting superconductive properties.

Figure 6:
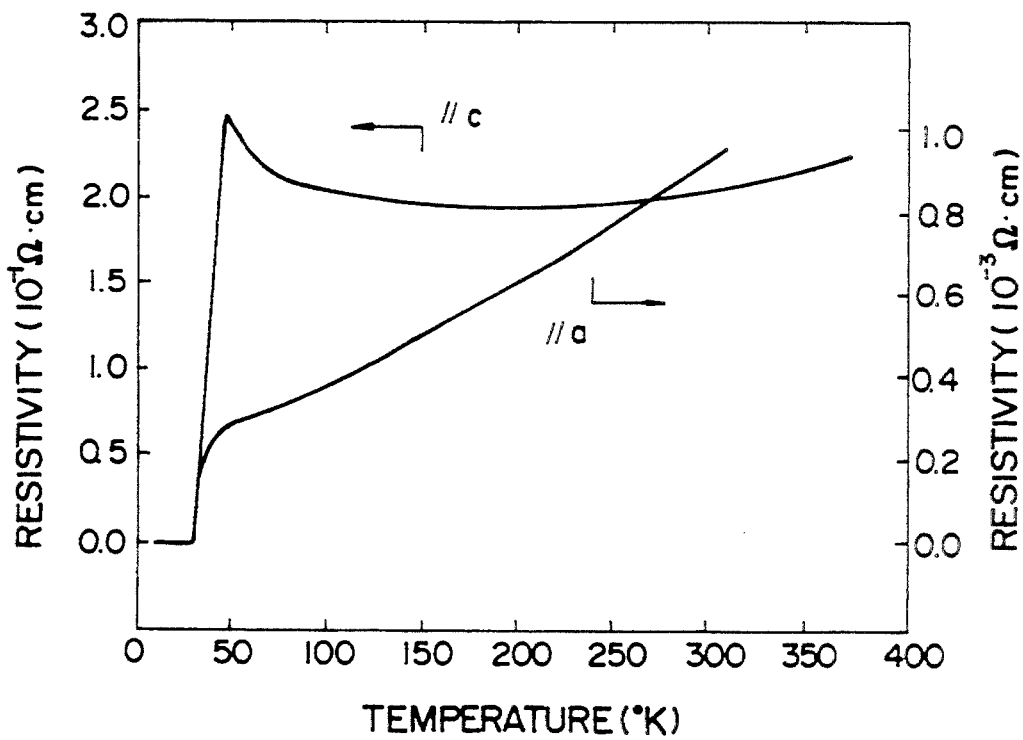
FIG. 6 is a diagram useful for explaining the variations with temperature of the electrical resistivity along the a-axis and c-axis, respectively of the $La_{0.186}Sr_{0.14}CuO_4$ grown crystal.

Referring to FIG. 6, there are illustrated the variations with temperature of the electric resistivities along the a-axis and c directions of the grown crystals. As will be seen from the FIG. 6, the electric resistivity along the a-axis (the Cu—O plane) was reduced to one several hundredth of that along the c-axis thus showing metallic behavior with temperature changes. On the contrary, while the variation with temperature of the resistivity along the c-axis shows metalic behavior down at about 200K but shows semiconductive behavior at the temperatures below 200K.

Also, it is considered that the behavior at around 200K corresponds to the tetragonal-orthorhombic transition. Thus it has been apparent that the grown crystals have a large anisotropy of the electrical resistivities.

TABLE 2

Chemical composition and lattice parameters of $LA_{2-x}Sr_xCuO_4$ grown single crystals

| | La | Sr | Cu | O | Total | | Lattice parameters (Å) | |
| --- | --- | --- | --- | --- | --- | --- | --- | --- |
| | | | | | | | a | c |
| Analyzed values (weight %) | 65.5 | 3.14(7) | 15.67(7) | 15.8(2) | 100.11 | (Measured Values) | 3.793(3) | 13.19(2) |
| Calculated values (x = 0.15) | 64.82 | 3.32 | 16.03 | 15.83 | 100.00 | (Sintered rod) (x = 0.15) | 3.790(3) | 13.21(3) |

EXAMPLE 2

Measurements of the Meissner's effect were performed on the grown crystals (a) obtained by the same method as in Example 1 and the crystals(b) obtained by annealing the grown crystals (a) at 500° C. for 50 hours in oxygen. The results obtained are shown in FIG. 7.

|  | $T_{conset}$ | $T_{end}$ |
|---|---|---|
| Grown crystals (a) | 31.5K | 18.0K |
| Grown crystals (b) | 35.0K | 23.5K |

Figure 7:
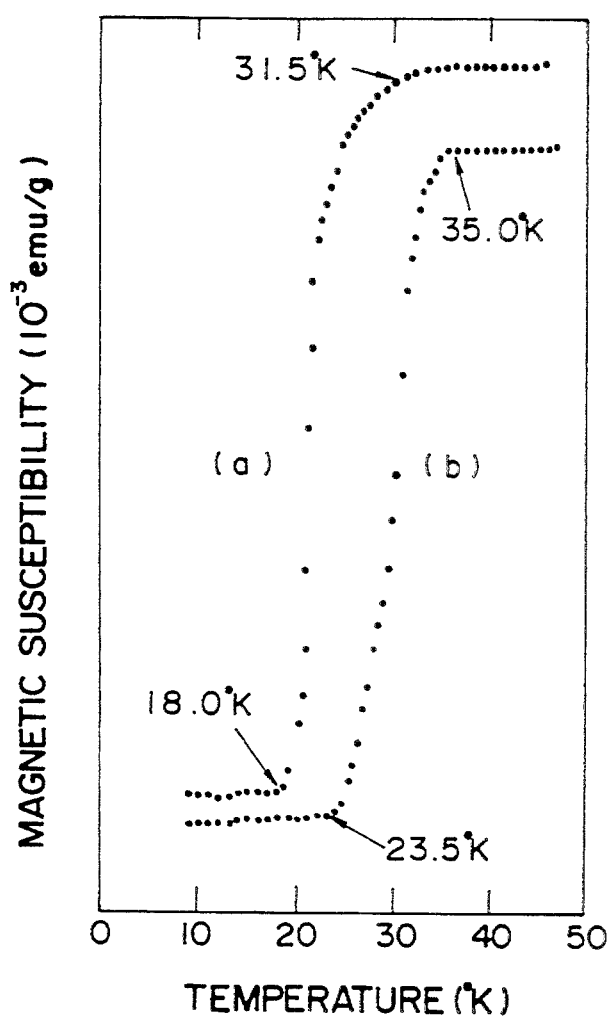
FIG. 7 is a graph showing the measured Meissner's effect in a second embodiment of the present invention.

As shown in FIG. 7, all of these grown crystals exhibited superconductive properties and the effect of the annealing was confirmed.

EXAMPLE 3

Firstly, the phase diagrams of the $Nd_2O_3$—CuO group and the $Nd_2$—$O_3$—$CeO_2$—CuO group essential for the synthesis of single crystals of the Nd—Ce—CuO—O group were investigated.

The powdered $Nd_2O_3$, $CeO_2$ and CuO were weighed out to obtain the desired compositions, mixed in a mortar for 30 minutes and calcined at 850° C. for 24 hours. The calcined samples were checked for their phase changes at elevated temperatures by a differential thermal balance TG-DTA. The measuring conditions were as follows. The heating and cooling were respectively effected at the rate of 5° C./min and the measurements were made in an atmosphere consisting of oxygen of 0.1 MPa using $Al_2O_3$ powder as the standard sample.

Also, after the calcined samples had been formed into round rods of 8 mm in diameter and pressed at 100 MPa by a hydrostatic press, the samples of the composition $Nd_2O_3$:CuO=1:1 were sintered at 1200° C. and the samples of the other compositions were sintered at 1000° C.

The melting tests were performed by using a single ellipsoidal infrared heating furnace of the type using a 1.5 KW halogen lamp as a heating light source as shown in FIG. 1 and the samples of the various compositions were melted and solidified by the previously mentioned SCFZ method.

The samples obtained by the SCFZ method were observed by the EPMA and the compositions were analyzed.

The results of analysis of the samples of the composition $Nd_2O_3$/CuO=1/1 by the TG-DTA showed that the peak heat absorption occurred at 1050° C. and 1270° C., respectively, during the temperature rise. On the other hand, the examination of the molten samples by the powder XRD method showed $Nd_2O_3$ in addition to $Nd_2CuO_4$. Then, when the sintered material of 60 mol % CuO was melted and solidified by the SCFZ method and then obserbed by the EPMA, a considerable amount of $Nd_2O_3$ was present in the primary crystal portion and considerable amounts of CuO and $Cu_2O$ were present in the forward end portion.

From this fact it was found out that the $Nd_2CuO_4$ was decomposed and melted into $Nd_2O_3$ plus a liquid at temperature higher than 1270° C. and the eutectic point of $Nd_2CuO_4$ was 1050° C.

Then, in order to determine the liquid phase composition which would exist in quilibrium with the $Nd_2CuO_4$, the sample of the CuO-rich compositions were analyzed by the TG-DTA and it was found out that the melt solidification temperature started to decrease with the samples containing more than 79 mol % CuO and it became closest to the eutectic point when the concentration was 91 mol % CuO.

When the sample containing 85 mol % CuO was melted and solidified by the SCFZ and observed by the EPMA, there was no formation of $Nd_2O_3$ and the primary crystal was $Nd_2CuO_4$. In other words, it was found out that there existed a liquidus line indicating that the melt was in equilibrium when the concentration was between 79 and 91 mol % CuO.

On the other hand, the use of the CuO-rich compositions showed that while two heat absorption peaks occurred during the temperature rise, three heat generation peaks occurred during the temperature drop after the melting. While the higher two of the three heat generation peaks correspond respectively to the heat absorption peaks during the temperature rise, here was no heat absorption peak corresponding to the third heat generation peak. Also, since the third peak increased in intensity with increase in the concentration of CuO serving as the solvent, it is considered that this is due to the information of $Cu_2O$ caused by the decomposition of CuO during the melting of the sample.

Figure 8:
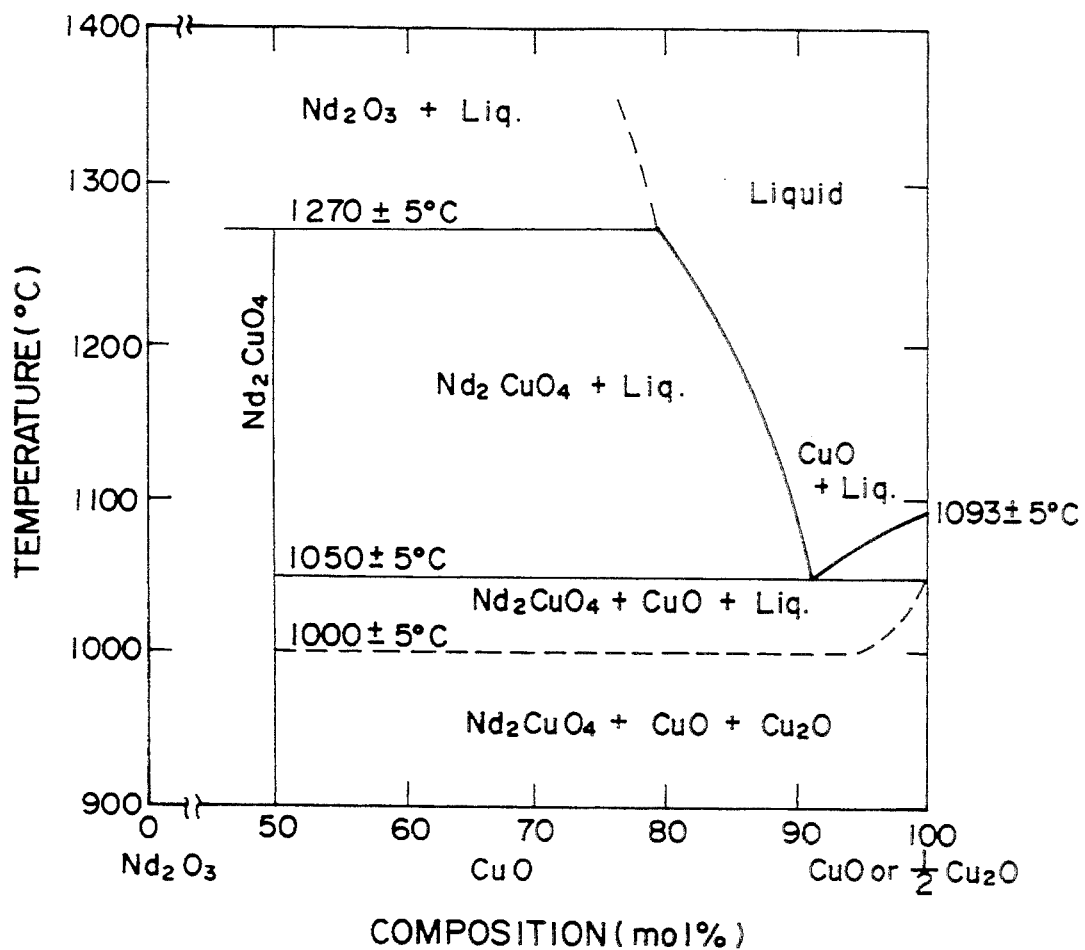
FIG. 8 is a phase diagram of the $Nd_2O_3$—CuO group.

FIG. 8 shows a phase diagram of the $Nd_2O_3$—CuO group derived from these facts.

Then, the sintered samples having the composition 92.5% $Nd_2O_3$+7.5% $CeO_2$/CuO=30/70 and 15/85 respectively, were melted and solidified by the SCFZ method and the resulting portions were observed. The sample containing 70 mol % CuO precipitated a solid solution of $Nd_2Ce_xO_{3+\delta}$ as the primary crystal.

Also, in the case of the sample containing 85 mol % CuO, no solid solution was precipitated and a phase of $Nd_{1.85}Ce_{0.15}CuO_{4-y}$ was precipitated first.

On the other hand, the results of the analysis by the TG-DTA showed that while there was no change with respect to the eutectic point, the peritectic point became 1315° C. and this was higher than that of the $Nd_2O_3$—CuO group by about 45° C. Then, it was found out that the composition range of the liquidus line where the phase of $Nd_{1.85}Ce_{0.15}CuO_{4-y}$ and the melt were in equilibrium with each other was slightly extended to a range of 78 to 91 mol % CuO.

Also, in the case of the Ce-added samples, there was the occurrence of a heat generation peak due to the solidification of $Cu_2O$ at around 1000° C.

Figure 9:
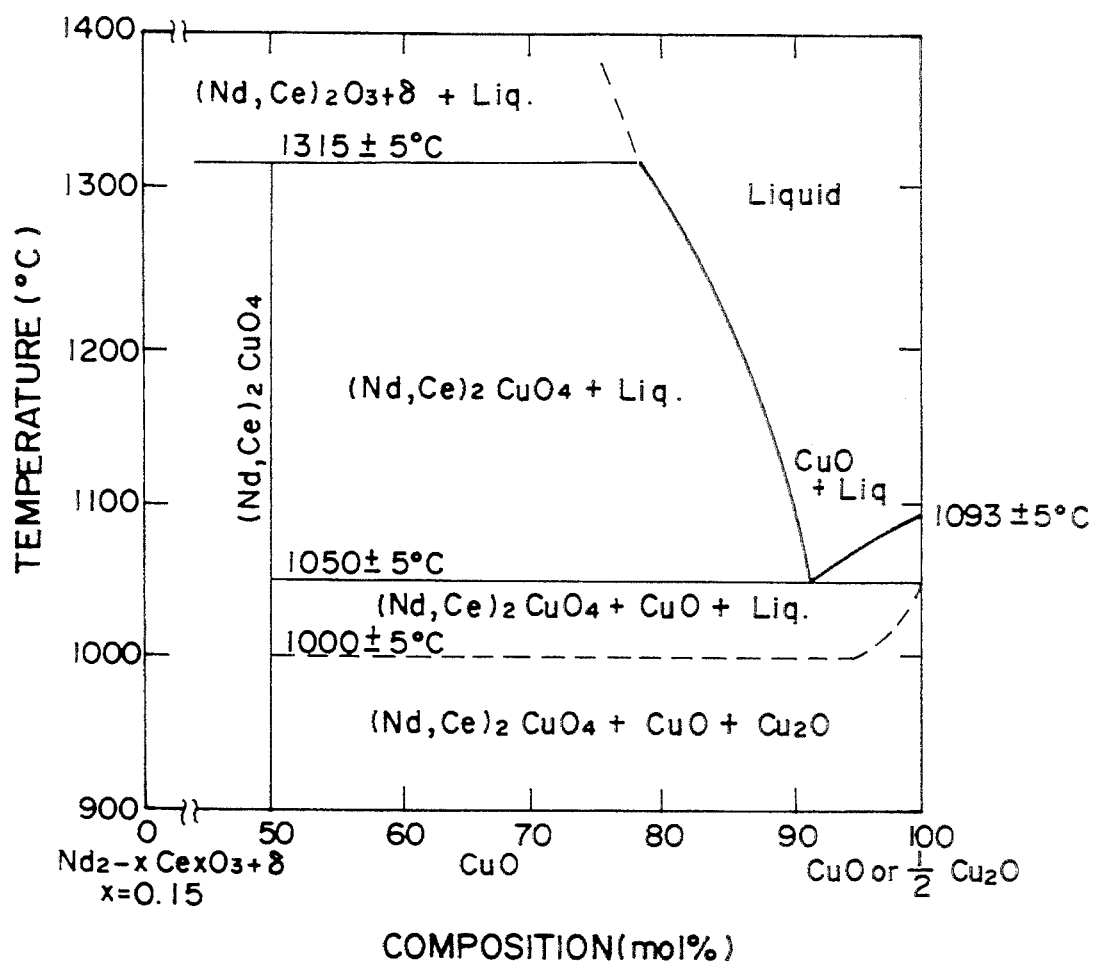
FIG. 9 is a phase diagram of the $(Nd,Ce)_2O_{3+\delta}$—CuO group.

In view of these circumstances, FIG. 9 shows the phase diagram of the $Nd_2O_3$—$CeO_2$—CuO group in the form of a pseudo binary system of $Nd_{2-x}Ce_xO_{3+\delta}$—CuO.

FIG. 9 shows that by using solvents having the compositions of 79 to 91 mol % CuO it is possible to grow single crystals of $Nd_{2-x}Ce_xCuO_4$ by the TSFZ method.

The growth of $Nd_{2-x}Ce_xCuO_4$ single crystals with Ce—0.15 was performed by the TSFZ method.

Using the same apparatus as in Example 1, the preparation of feed rods 4 was effected by weighing out the powdered oxides of $Nd_2O_3$, $CeO_2$ and CuO in proportions to attain the stoichiometric composition of $Nd_{2-x}Ce_xCuO_4$, mixing the powdered oxides at 850° C. for 24 hours forming the calcined mixture into round rods of about 6 mm in diameter and 50 mm in length by the same rubber press method as in the case of Example 1 and sintering the round rods at 1100° to 1200° C. for 12 hours in oxygen, thereby preparing the feed rods 4.

Then, after the raw material had been weighed out to obtain the composition of 80 mol % CuO solvents were synthesized in the same manner as the feed rods 4.

The same double ellipsoidal-type infrared heating furnace as in example 1 was used for the growth of single crystals.

The growth conditions included the growth rate of 0.5 to 3.0 mm/h and the growing atmosphere consisting of pure oxygen with a gas pressure between 0.1 and 0.25 MPa. In addition, seed crystals were grown by the necking growth and the crystal growth was effected along the a-axis.

As a result, the grown single crystals of $Nd_{2-x}Ce_x$-$CuO_4$ contained the solid solutions of $Nd_{1.48}Ce_{0.52}O_{3+\delta}$ in large amounts and they were fragile.

Figure 10:
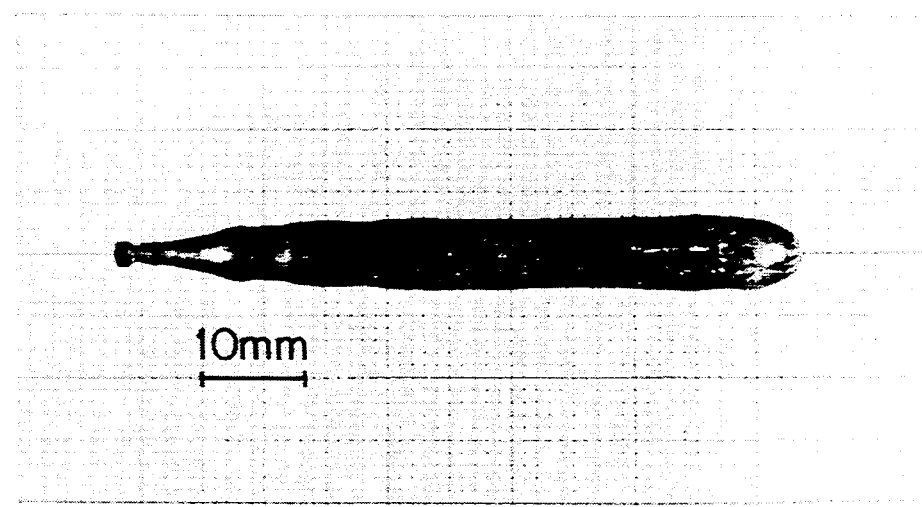
FIG. 10 is a photograph showing the structure of a grown crystal of $Nd_{2-x}Ce_xCuO4$ according to a third embodiment of the present invention.

FIG. 10 is a photograph showing the structure of a grown single crystal of $Nd_{2-x}Ce_xCuO_4$ produced by using solvent of 80 mol % CuO.

The grown crystal was 5 mm in diameter and 50 mm in length, was black colored with no metallic luster and had a parallel cleavage plane along the c-plane.

The single crystal contained a trace amount of sub-crystal boundary structure and some amount of CuO and it had a size of about $2 \times 3 \times 5$ mm$^3$. As the result of the quantitative analysis by the EMMA, the composition was determined to be $Nd_{1.86}Ce_{0.14}CuO_4$ and the composition was slightly reduced in Ce as compared with the feed composition of $Nd_{1.85}Ce_{0.15}CuO_4$. The precipitation of CuO was caused as the result of a change in the composition of the molten zone and the composition changed to a Cu-rich one. Thus, it is evident that the optimum composition of the melt is between 80 and 85 mol % CuO.

Next, the magnetic properties of the single crystals were evaluated.

The Meissner's effect was not obtained from the grown crystals of $Nd_{1.86}Ce_{0.14}CuO_4$. The $Nd_{2-x}Ce_x$-$CuO_4$ single crystals annealed in their reduced conditions became superconductive. While it had been reported that the $Nd_{2-x}Ce_xCuO_4$ single crystals grown in the deoxidation range by the TSFZ method would exhibit superconductive properties with Tc of below 10K, the single crystal according to the present test were grown within the oxygen range for the purpose of preventing vaporization of the cupric copper and therefore these single crystals did not exhibit superconductive properties.

After the thus prepared $Nd_{1.86}Ce_{0.14}CuO_4$ crystals had been annealed at 900° C. in a gaseous nitrogen for 70 hours, the Meissner's effect in the crystals was investigated. The results obtained are shown in FIG. 11.

Figure 11:
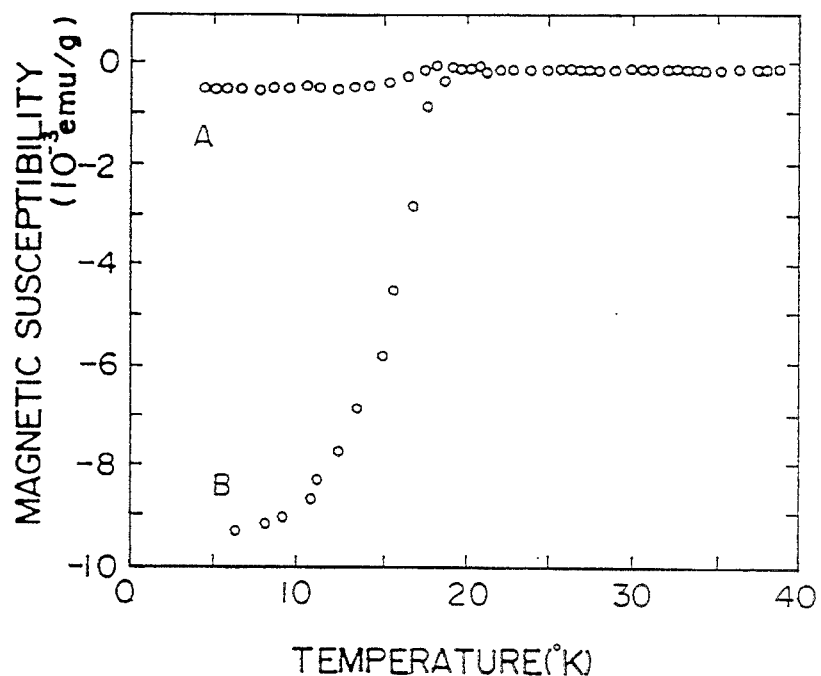
FIG. 11 is a graph showing the measured Meissner's effect in the third embodiment of the present invention.

FIG. 11 shows the temperature dependency of the magnetization of the annealed crystals of $Nd_{1.86}Ce_{0.14}CuO_4$.

As shown in FIG. 11, the value of Tc was 19K in the case of the annealed crystal of $Nd_{1.86}Ce_{0.14}CuO_4$ and its temperature was lower than that of the previously reported $Nd_{2-x}Ce_xCuO_4$ single crystal Its temperature decrease was considered to be due to the precipitation of the CuO in the grown crystal and the annealing conditions. From the foregoing description it will be seen that in accordance with the manufacturing method of the present invention the superconductive single crystrals of $La_{2-x}Sr_xCuO_{4-y}$ and $Nd_{2-x}Ce_xCuO_4$ can be increased in size and the present invention is equally applicable to the single crystals of $YBa_2Cu_3O_{7-x}$, $BiSrCaCu_2O_x$ and $Tl_2Ba_2Ca_2Cu_3O_x$.

We claim:

1. A method for manufacturing a single crystal of a superconductive oxide by growing a single crystal on a seed crystal based on the traveling solvent floating zone method, wherein the solvent is sandwiched between a sintered feed rod and the seed crystal, said solvent being melted so as to fuse together the sintered feed rod and the seed crystal, wherein said superconductive oxide is selected from the group consisting of:

| | |
|---|---|
| $La_{2-a}Sr_aCuO_4$, | $0 \leq a \leq 0.3$ |
| $La_{2-b}Ba_bCuO_4$, | $0 \leq b \leq 0.13$ |
| $Nd_{2-c}Ce_cCuO_4$, | $0.12 < c < 0.17$ |
| $YBa_2Cu_3O_{7-d}$, | $0 < d < 0.5$ |
| $BiSrCaCu_2O_e$, and | $8.5 < e < 9.5$ |
| $Tl_2Ba_2Ca_2Cu_3O_f$ | $9.5 < f < 10.5$ | which comprises selecting the starting materials on the basis of the stoichiometric composition of said superconductive oxide and mixing them in ethanol, then preliminarily calcining the material at 800° C. to 950° C., forming the thus-calcinated powder onto a round rod by the application of pressure, sintering the rod at 1000° to 1200° C. in the presence of oxygen, thus resulting in said sintered feed rod and said solvent, melting said sintered feed rod in the presence of a solvent stratum, the solvent having a composition of 55 to 91 mol % CuO, and placing these materials in an infrared heating furnace under oxygen pressure, thus affording the growth of a single crystal of said superconductive oxide to a size greater than 5 mm in diameter and greater than 40 mm in length under the following growth conditions:

| | |
|---|---|
| Oxygen pressure | 0.15 MPA or more |
| Growth temperature | 1100° to 1300° C. |
| Growth rate | 0.15 to 3 mm/h. |

2. A manufacturing method according to claim 1, wherein a seed crystal is used for the growth of said single crystal.

3. A manufacturing method according to claim 2, wherein said seed crystal is produced by growing a crystal along an a-axis thereof by a necking growth process.

4. A manufacturing method according to claim 3, wherein said single crystal is annealed in the presence of oxygen or nitrogen.

5. A method for manufacturing a single crystal of superconductive oxide according to claim 4, wherein said single crystal is annealed in the presence of oxygen or nitrogen.

6. A method for manufacturing a single crystal of superconductive oxide wherein a sintered feed rod having the stoichiometric composition of said oxide is melted in a solvent stratum mainly consisting of an oxide of copper and arranged in a light-heating furnace under oxygen pressure, and growing a single crystal of said superconductive oxide to a size greater than 5 mm in the diameter and greater than 40 mm in the length; wherein said superconductive oxide is selected from the tetragonal system and the orthorhombic systems, and wherein said superconductive oxide is melted into a solvent said solvent consisting essentially of a composition of 55 to 91 mol % CuO, and growing said single crystal under the following growth conditions:

| | |
|---|---|
| oxygen pressure | 0.15 MPa or more. |

| -continued | |
|---|---|
| Growth pressure | 1100 to 1300° C. |
| Growth rate | 0.5 to 3 mm/h. |

7. A single crystal of a superconductive oxide belonging to a tetragonal system and exhibiting anisotropic properties and superconductive properties, wherein said single crystal is made by melting a sintered feed rod having a stoichiometric composition of said superconductive oxide into a solvent stratum mainly consisting of a copper oxide and arranged in a light heating furnace under oxygen pressure and wherein the single crystal size is at least 5 mm in the diameter and at least more than 40 mm in the length; and wherein said superconductive oxide is selected from the group consisting of:

| | |
|---|---|
| $La_{2-a}Sr_aCuO_4$ | $0 \leq a \leq 0.3$ |
| $La_{2-b}Ba_bCuO_4$ | $0 \leq b \leq 0.13$ |
| $Nd_{2-c}Ce_cCuO_4$ | $0.12 < c < 0.17$ |
| $YBa_2Cu_3O_{7-d}$ | $0 < d < 0.5$ |
| $BiSrCaCu_2O_e$ | $8.5 < e < 9.5$ |
| $Tl_2Ba_2Ca_2Cu_3O_f$ | $9.5 < f < 10.5$ |

8. A superconductive oxide single crystal according to claim 1, wherein said oxide is $La_{2-a}Sr_aCuO_4$ or $La_{2-b}Ba_bCuO_4$ properties with Tc being 30K or over and $\Delta T_c$ being 10K or less.

* * * * *